United States Patent
Sun

(10) Patent No.: US 8,254,123 B2
(45) Date of Patent: Aug. 28, 2012

(54) MOUNTING APPARATUS FOR EXPANSION CARD

(75) Inventor: Zheng-Heng Sun, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 189 days.

(21) Appl. No.: 12/881,136

(22) Filed: Sep. 13, 2010

(65) Prior Publication Data
US 2012/0033380 A1 Feb. 9, 2012

(30) Foreign Application Priority Data
Aug. 9, 2010 (CN) .......................... 2010 1 0248509

(51) Int. Cl.
*H05K 7/20* (2006.01)
*H05K 7/14* (2006.01)
*H01R 13/62* (2006.01)

(52) U.S. Cl. ........ 361/695; 361/715; 361/716; 361/721; 361/740; 361/801; 439/153; 439/159; 439/160

(58) Field of Classification Search .................. None
See application file for complete search history.

(56) References Cited

U.S. PATENT DOCUMENTS

| | | | | |
|---|---|---|---|---|
| 5,642,263 | A  * | 6/1997 | Lauruhn | 361/801 |
| 7,517,239 | B1 * | 4/2009 | Ju | 439/159 |
| 7,637,748 | B2 * | 12/2009 | Chung et al. | 439/59 |
| 7,828,564 | B2 * | 11/2010 | Guan et al. | 439/135 |
| 8,070,499 | B2 * | 12/2011 | Guan et al. | 439/155 |

* cited by examiner

*Primary Examiner* — Boris Chervinsky
(74) *Attorney, Agent, or Firm* — Altis Law Group, Inc.

(57) ABSTRACT

A mounting apparatus for mounting an expansion card to a printed circuit board (PCB), includes a connector on the PCB, and a latch member pivotably connected to the connector. The connector defines a slot to receive the expansion card. The latch member is a rectangular wire frame comprising a lock portion, two connection arms extending down from the lock portion, and two pivot portions extending from distal ends of the connection arms toward each other. The pivot portions are pivotably attached to two sidewalls of the connector. After the expansion card is plugged into the slot of the connector, the latch member is pivoted to make the lock portion press against a portion of the expansion card, thereby locking the expansion card to the connector.

10 Claims, 6 Drawing Sheets

MOUNTING APPARATUS FOR EXPANSION CARD

BACKGROUND

1. Technical Field

The present disclosure relates to mounting apparatuses and, more particularly, to a mounting apparatus for an expansion card.

2. Description of Related Art

An expansion card, such as a memory card, is often installed in an electronic device, such as a computer or a server with a mounting apparatus. The mounting apparatus includes two opposite fixing plates for clamping two opposite ends of the expansion card. However, the fixing plates may block airflow to the expansion card. In a chassis having a plurality of expansion cards arranged in parallel, heat produced by the expansion cards can only be dissipated through the narrow spaces between the cards, which is inefficient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
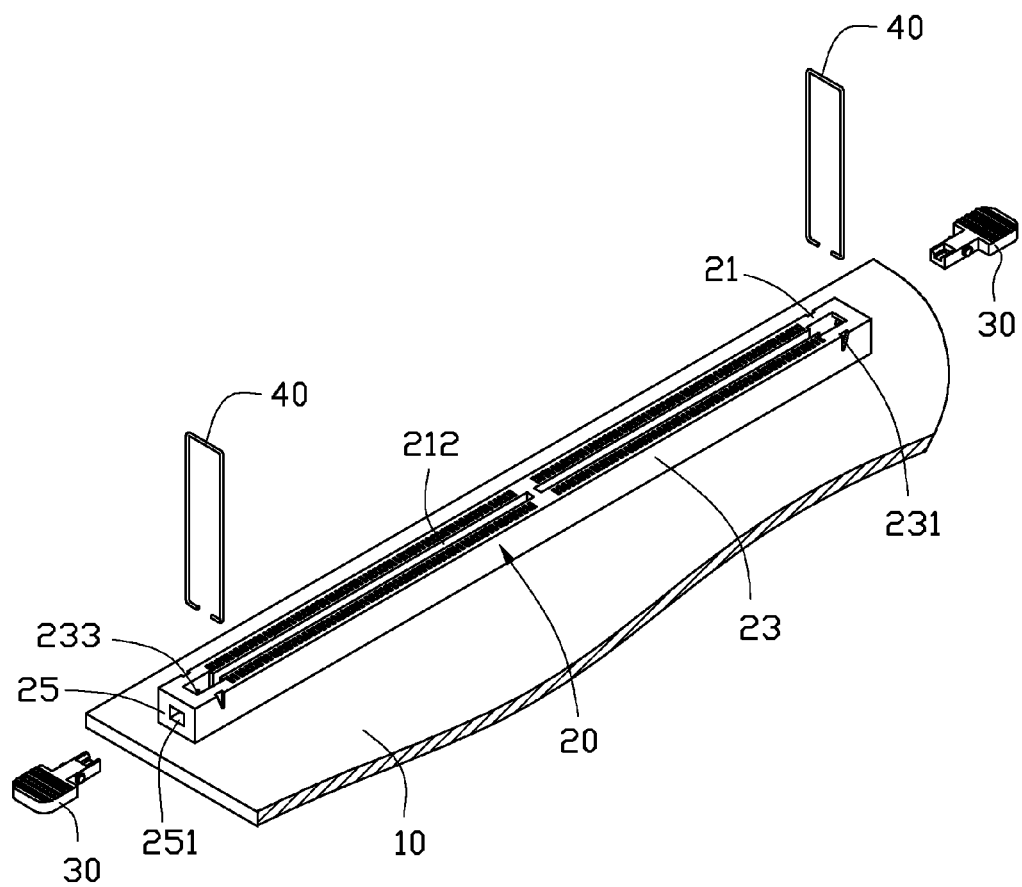
FIG. 1 is an exploded, isometric view of an embodiment of a mounting apparatus for an expansion card.
Figure 2:
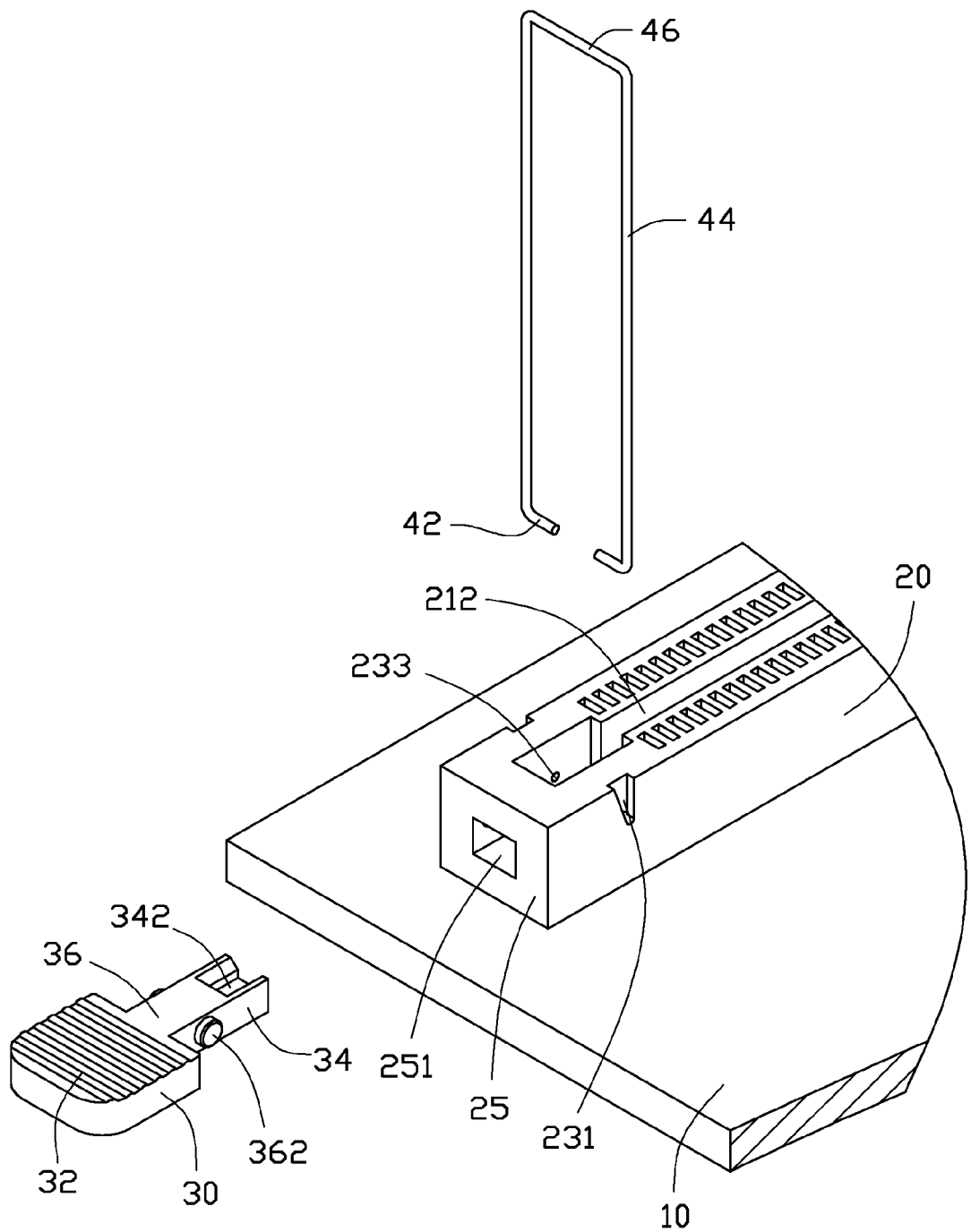
FIG. 2 is a partial, enlarged view of FIG. 1.

Referring to FIGS. 1 and 2, one embodiment of a mounting apparatus is provided to mount an expansion card to a printed circuit board (PCB) 10. The mounting apparatus includes a connector 20 installed on the PCB 10, two operation members 30, and two latch members 40.

The connector 20 is elongated, and includes a top surface 21 and two sidewalls 23 perpendicular to the top surface 21. The connector 20 further includes two opposite end walls 25. The top surface 21 defines two slots 212 arranged in a line between the end walls 25. Each end wall 25 defines a through hole 251 communicating with the corresponding slot 212. Each sidewall 23 defines two V-shaped notches 231 in the vicinity of the two end walls 25, respectively. A pivot hole 233 is defined in each notch 231.

Each operation member 30 is substantially T-shaped, and includes a pressing portion 32, an ejection portion 34, and a pivot portion 36 connected between the pressing portion 32 and the ejection portion 34. A pivot post 362 extends out from each of two opposite sides of the pivot portion 36. A recess 342 is defined in the ejection portion 34.

Each latch member 40 is a substantially rectangular-shaped frame, and includes a lock portion 46, two connection arms 44 perpendicularly extending down from two opposite ends of the lock portion 46, and two pivot portions 42 extending from distal ends of the connection arms 44 toward each other. In this embodiment, the latch member 40 is made by bending a flexible metal wire to the desired shape.

Figure 3:
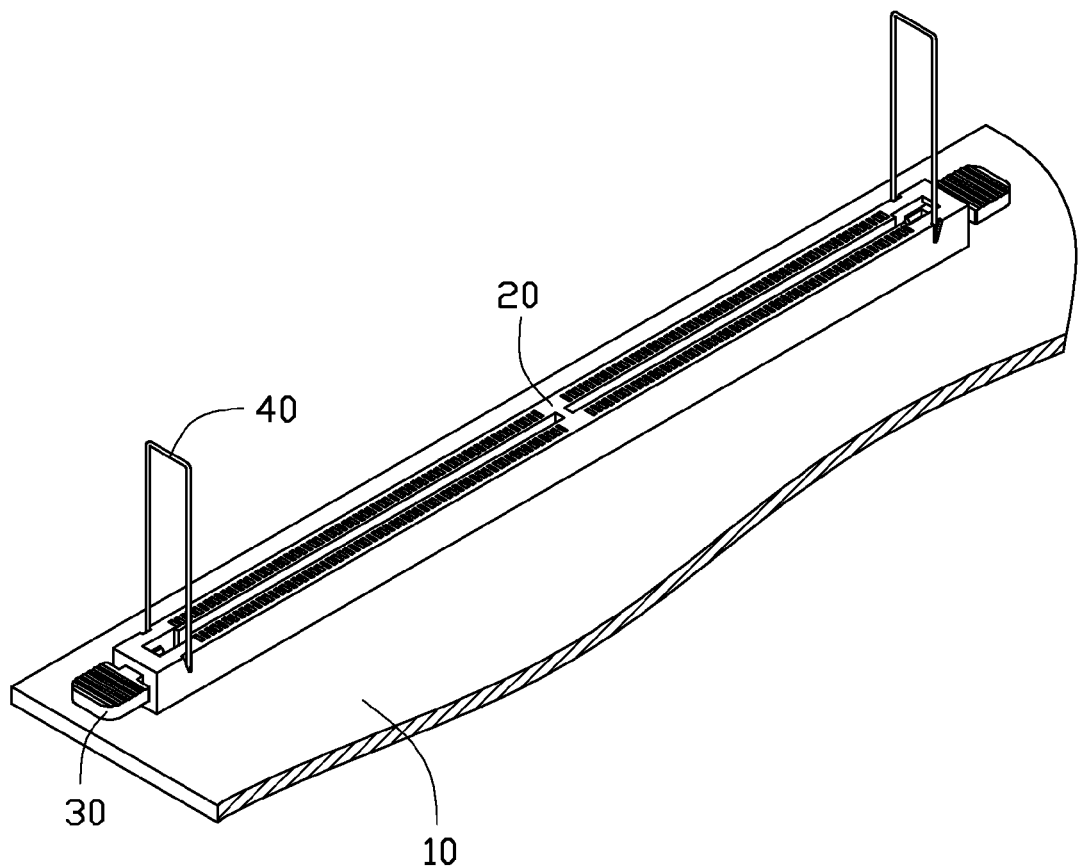
FIG. 3 is an assembled view of FIG. 1.

Referring to FIG. 3, in assembly, the ejection portion 34 and the pivot portion 36 of each operation member 30 are inserted into the corresponding through hole 251 of the connector 20, with the pivot posts 362 of the pivot portion 36 pivotably engaged in the corresponding through hole 251, the ejection portion 34 located in the corresponding slot 212, and the pressing portion 32 located outside the connector 20. The pivot portions 42 of the latch member 40 are pivotably engaged in the pivot holes 233 of the connector 20. Two sidewalls of each V-shaped notch 231 confine the pivot angle of the corresponding latch member 40.

Figure 4:
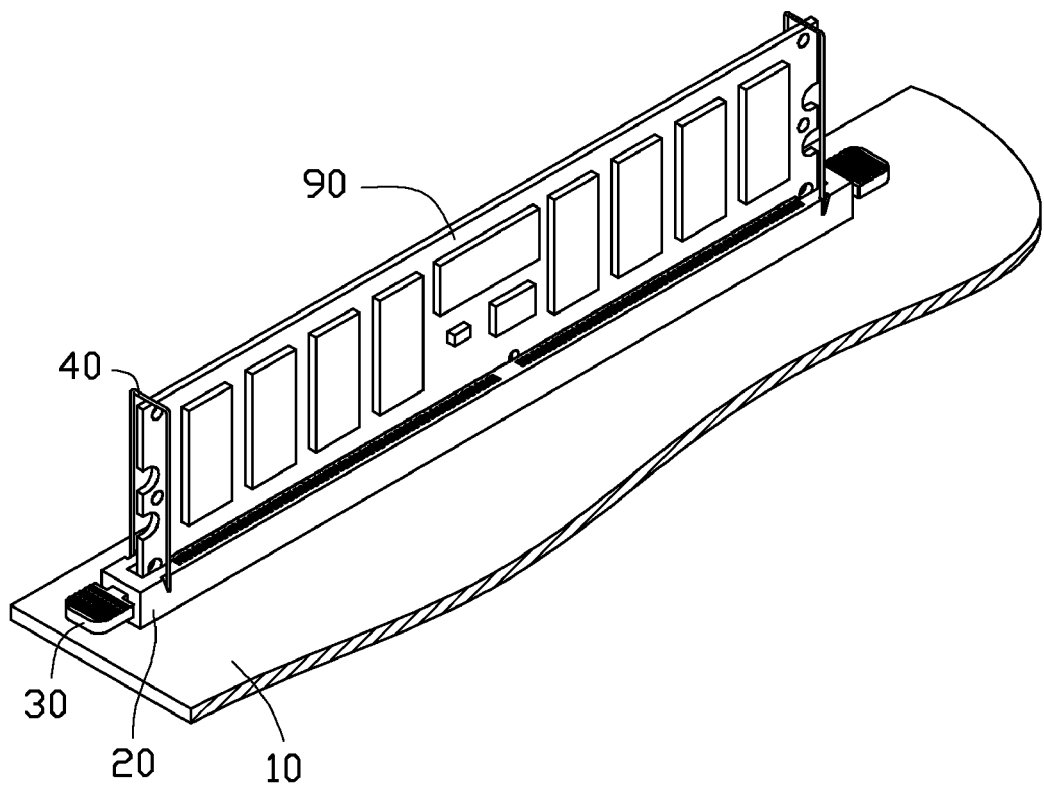
FIG. 4 is similar to FIG. 3, but with an expansion card locked in the mounting apparatus.

Referring to FIG. 4, an expansion card 90 is plugged into the slot 212 of the connector 20, with two opposite ends of the lower edge of the expansion card 90 received in and pressing against the recesses 342 of the ejection portion 34 of the operation member 30. The latch members 40 are pivoted such that the lock portions 46 press against the upper edge of the expansion card 90, thereby locking the expansion card 90 to the connector 20.

To detach the expansion card 90 from the mounting apparatus, the latch members 40 are pivoted away to disengage from the upper edge of the expansion card 90. The pressing portion 32 of each operation portion 30 is depressed so that the ejection portion 34 is tilted to eject the expansion card 90 out of the slots 212 of the connector 20.

Figure 5:
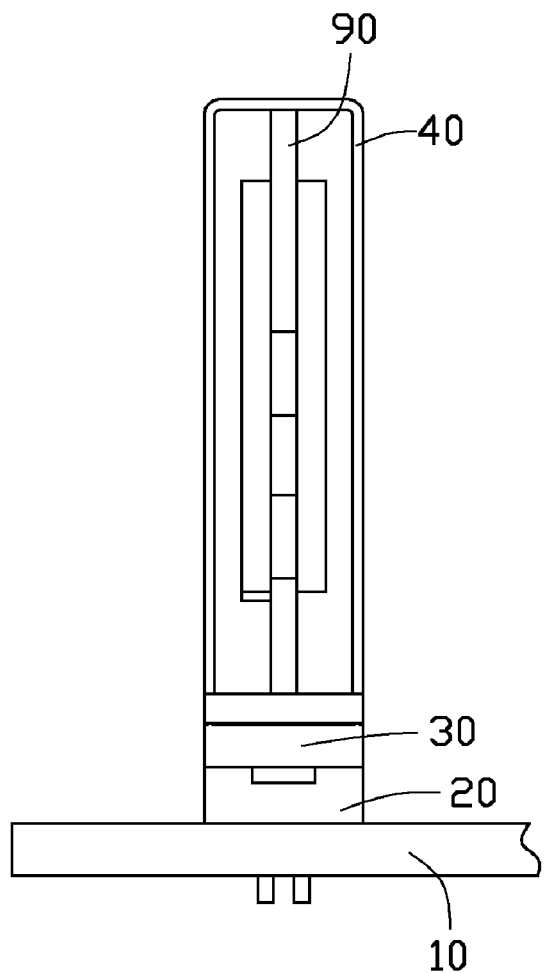
FIG. 5 is a side view of FIG. 4.
Figure 6:
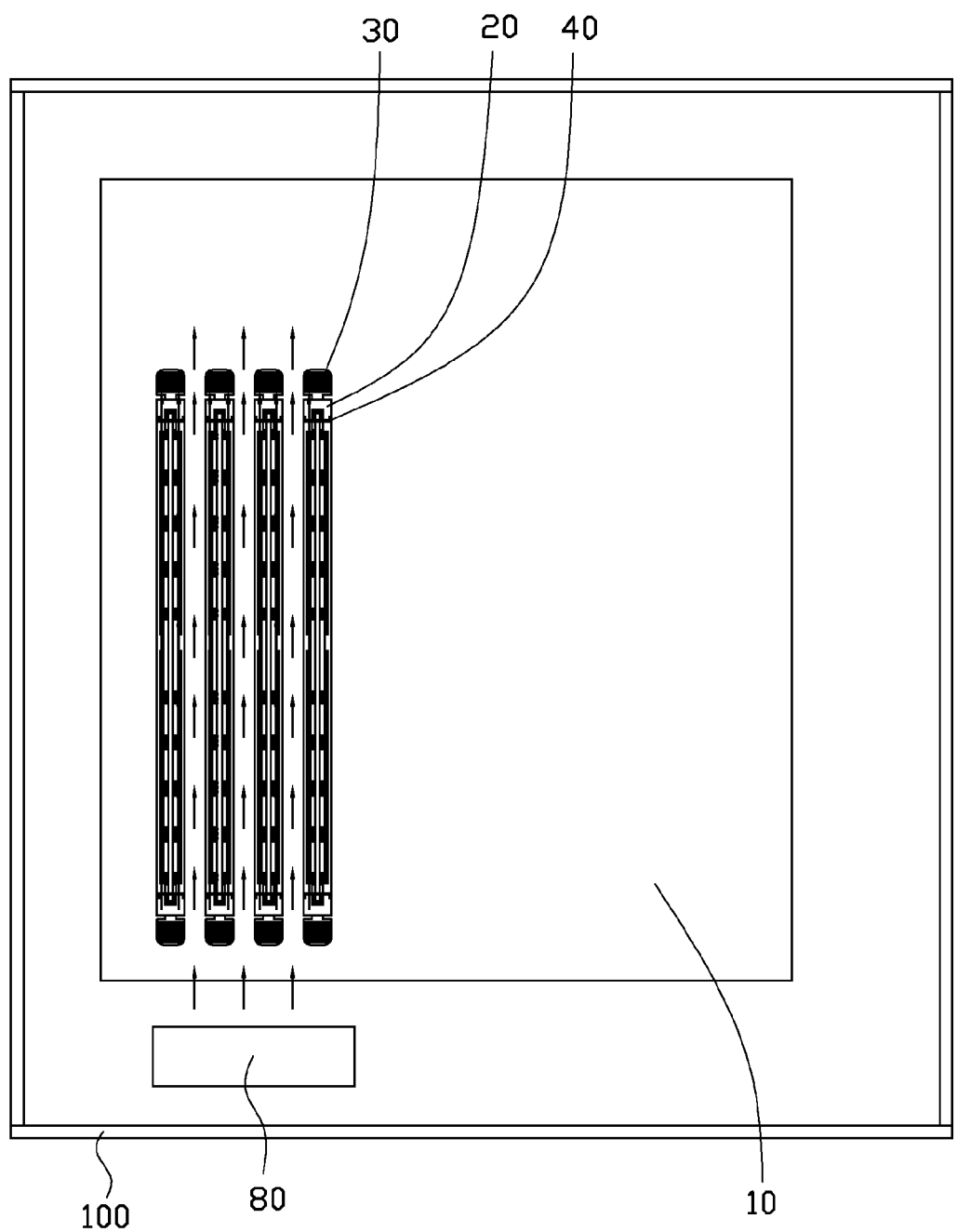
FIG. 6 is a schematic top view showing the mounting apparatus for expansion cards applied in an electronic system.

Referring to FIGS. 6 and 5, an electronic system includes an enclosure 100, and a fan 80 installed in the enclosure 100. The PCB 10 is installed in the enclosure 100, with a plurality of expansion cards 10 arranged on the PCB 10 in parallel. The fan 80 is arranged beside the PCB 10 in a position that aligns airflow from the fan 80 with passages between the expansion cards 10. Because the latch members 40 are frame-shaped and made of wire, the latch members 40 block only a little, if any, airflow, thus greatly enhancing dissipation of heat of the expansion cards 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for mounting an expansion card to a printed circuit board (PCB), the mounting apparatus comprising:

a connector mounted on the PCB, and comprising a top surface and two sidewalls, the top surface defines a slot for engagingly receiving a portion of the expansion card; and a latch member, being a substantially rectangular frame, formed by a wire, and comprising a lock portion, two connection arms extending down from two opposite ends of the lock portion, and two pivot portions extending from distal ends of the connection arms toward each other, wherein the pivot portions are pivotably attached to the sidewalls of the connector, and after the expansion card is plugged in the slot of the connector, the latch member is pivoted to the connector to make the lock portion to press against a portion of the expansion card, thereby locking the expansion card to the connector.

2. The mounting apparatus of claim 1, wherein the connector further comprises two opposite end walls each defining a through hole communicating with the slot; each through hole receives an operation member, the operating member comprises a pressing portion, an ejection portion and a pivot portion connected between the pressing portion and the ejection portion; the pivot portion is pivotably engaged in the corresponding through hole, the ejection portion is located in the slot, and the pressing portion is located outside the corresponding through hole; to detach the expansion card, the pressing portion is depressed such that the ejection portion is tilted to eject the expansion card out of the slot of the connector.

3. The mounting apparatus of claim 2, wherein the ejection portion defines a recess therein, when the expansion card is locked in the slot of the connector, the bottom portion of the expansion card is received in the recess and depresses the ejection portion.

4. The mounting apparatus of claim 1, wherein each of the sidewalls of the connector defines a notch, and a pivot hole in the notch; the pivot portions of the latch member pivotably engage in the pivot holes of the sidewalls.

5. The mounting apparatus of claim 4, wherein the notch is substantially V-shaped, two sidewalls of the V-shaped notch confine a pivot angle for the latch member.

6. The mounting apparatus of claim 4, wherein the latch member is made by bending a flexible metal wire.

7. An electronic system comprising:
an enclosure;
a fan installed in the enclosure;
an expansion card;
a printed circuit board (PCB) installed in the enclosure, and comprising a connector and a latch member pivotably connected to the connector, the connector comprising a top surface and two sidewalls, the top surface defines a slot to receive the expansion card, the latch member is a wire frame, and comprising a lock portion, two connection arms extending down from the lock portion, and two pivot portions extending from distal ends of the connection arms toward each other, the pivot portion pivotably attached to the sidewalls of the connector; wherein after the expansion card is plugged in the slot of the connector, the latch member is pivoted to the connector to make the lock portion to press against an upper edge of the expansion card, thereby locking the expansion card to the connector.

8. The electronic system of claim 7, wherein the connector further comprises two opposite end walls each defining a through hole communicating with the slot; each through hole receives an operation member, the operating member comprises a pressing portion, an ejection portion and a pivot portion connected between the pressing portion and the ejection portion; the pivot portion is pivotably engaged in the corresponding through hole, the ejection portion is located in the slot, and the pressing portion is located outside the corresponding through hole; to detach the expansion card, the pressing portion is depressed such that the ejection portion is tilted to eject the expansion card out of the slot of the connector.

9. The electronic system of claim 7, wherein each of the sidewalls of the connector defines a notch, and a pivot hole in the notch; the pivot portions of the latch member pivotably engage in the pivot holes of the sidewalls.

10. The electronic system of claim 9, wherein the notch is substantially V-shaped, two sidewalls of the V-shaped notch confine a pivot angle for the latch member.

* * * * *